United States Patent [19]

Patel et al.

[11] Patent Number: 5,715,264
[45] Date of Patent: Feb. 3, 1998

[54] LASER DIODE ARRAY

[75] Inventors: Rushikesh Patel; Robert Morris; Michael Ung, all of Tucson, Ariz.

[73] Assignee: Opto Power Corporation, Tucson, Ariz.

[21] Appl. No.: 713,261

[22] Filed: Sep. 12, 1996

[51] Int. Cl.$^6$ .............................. H01S 3/04; H01S 3/091
[52] U.S. Cl. ............................................. 372/36; 372/75
[58] Field of Search .............................. 372/50, 36, 33, 372/38, 75

[56] References Cited

U.S. PATENT DOCUMENTS

| | | | |
|---|---|---|---|
| 5,099,488 | 3/1992 | Ahrabi et al. | 372/36 |
| 5,199,039 | 3/1993 | Raper | 372/38 |
| 5,305,344 | 4/1994 | Patel | 372/36 |
| 5,311,530 | 5/1994 | Wagner et al. | 372/36 |
| 5,325,384 | 6/1994 | Herb et al. | 372/36 |
| 5,550,852 | 8/1996 | Patel et al. | 372/33 |

*Primary Examiner*—Rodney B. Bovernick
*Assistant Examiner*—Luong-Quyen T. Phan
*Attorney, Agent, or Firm*—Herbert M. Shapiro

[57] ABSTRACT

An assembly of simple, like laser diode submounts or laser diode bars lend themselves to volume manufacturing techniques. Individual diodes, or diode bars are supported on electrically-insulating submounts which have electrically-isolated metallizations applied thereto for mounting on a single insulating plate and to one another in a stack and for mounting to a common heat sink.

6 Claims, 2 Drawing Sheets

LASER DIODE ARRAY

FIELD OF THE INVENTION

This invention relates to a one or two-dimensional laser array and more particularly to a stack of laser diodes sharing a common heat sink.

BACKGROUND OF THE INVENTION

Laser diodes have been assembled into linear arrays and laser bars, each with a plurality of emitting facets, have been assembled into stacks to form a two dimensional laser diode array. Examples of both one and two-dimensional laser diode arrays are disclosed in U.S. Pat. No. 5,040,187, issued Aug. 13, 1991 which is incorporated herein by reference. The arrays described in that patent require the provision of parallel grooves in the surface of a monolithic substrate each having a depth and having a width to receive a laser diode. The array is difficult to make and is costly.

BRIEF DESCRIPTION OF THE INVENTION

In accordance with one embodiment of this invention, a stack of individual laser diode subassemblies is positioned on a bottom plate, each subassembly including a pattern of electrically-isolated metallizations on the surfaces thereof. One portion of the pattern provides an electrical path from one diode of the stack to the adjacent diodes of the stack another to the bottom plate and a third to a common heat sink to provide an operating equivalent of the one-dimensional array disclosed in the above-identified patent without costly processing. The assembly is adaptable to automatic assembly techniques. In accordance with another embodiment, laser bars are stacked, instead of individual laser diodes, forming a two-dimensional array.

The recognition that selective metallizations permit the formation of electrically-isolated, electrical paths as well as permanent physical contact leads to an easily automated laser diode array.

In another embodiment, each diode array is provided with a ledge for receiving a microlens in a position which is self aligning due to the physical configuration of the ledge itself.

DETAILED DESCRIPTION OF ILLUSTRATIVE EMBODIMENTS OF THIS INVENTION

Figure 1:
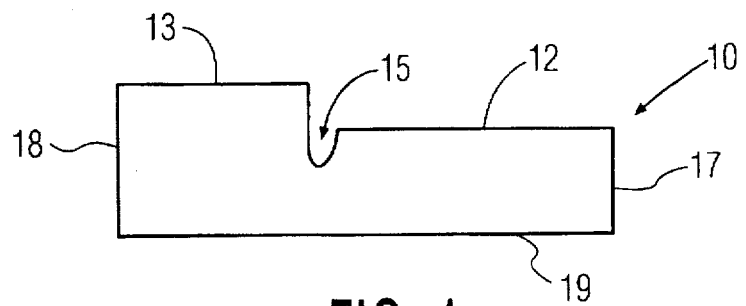
FIGS. 1–4 are schematic illustrations of an end view of a laser diode stack in accordance with the principles of this invention at successive stages during assembly.

FIG. 1 shows a side view of an electrically insulating diode submount 10. The submount has a step-like profile comprising a first tread 12, a second tread 13 and a riser 14 therebetween. A notch 15 is formed to the left of tread 12 (as viewed) at the bottom of the riser. The submount has a front face 17, a rear face 18 and a bottom face 19 and is made from, for example, Berillium Oxide (BeO).

Figure 2:
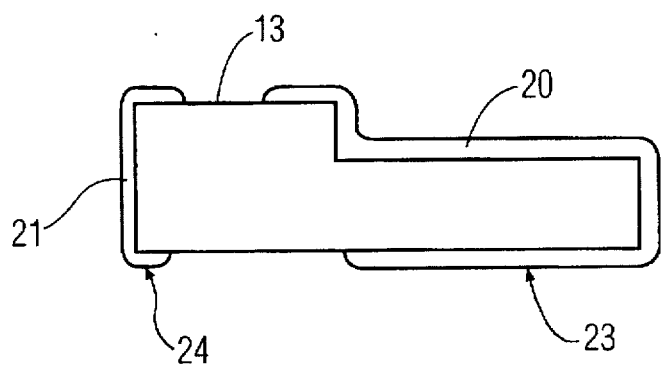

Two electrically-isolated metallizations, 20 and 21, are formed on the submount as shown in FIG. 2. Metallization 20 coats a front portion of tread 13 as well as riser 14, first tread 12, front face 17 and the front portion of bottom face 19 as indicated by arrow 23. The second metallization coats the back portion of tread 13 as well as the rear face 18 and the back portion of bottom face 19 as indicated by arrow 24. Note that notch 15 is not shown in FIG. 2 to show that metallization 20 is continuous when first formed but is separated intofirst and second, electrically-isolated portions 31 and 32 when notch 15 is later formed.

The notch serves not only to separate metallization 20 into two portions, but also to ensure that riser 14 is perpendicular to tread 12. The reason for this is to provide a proper bearing surface against which laser diodes are placed. Specifically, in the illustrative embodiments, a reverse diode and a forward diode, 34 and 35, are placed on tread 12 such that the diodes abutt riser 14 with the front face of diode 35 being aligned with the front face 17 of the submount and the top faces of diodes 34 and 35 are in a plane with tread 13. The subassembly of FIG. 3, including a submount, with diodes in place constitutes a unit of the stack (or assembly) shown in FIG. 4.

Figure 3:
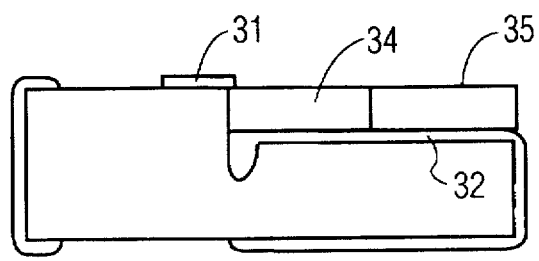
Figure 4:
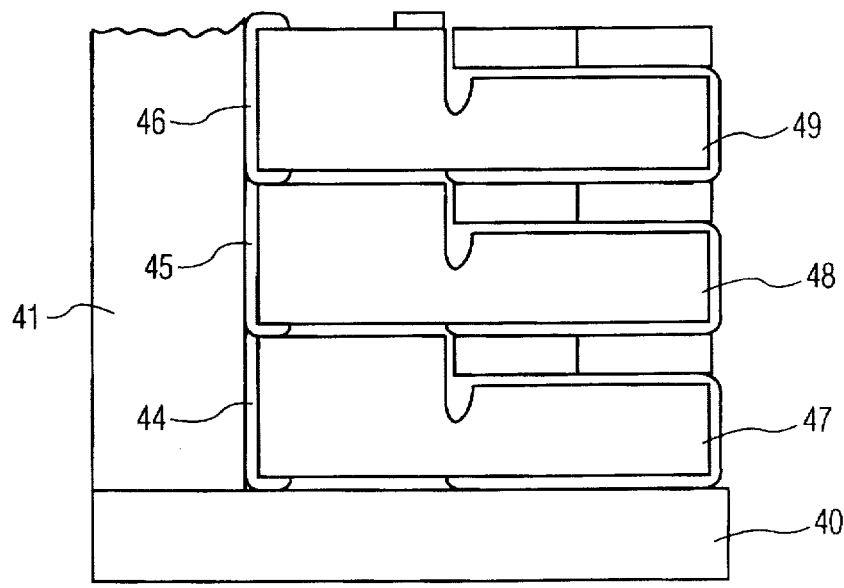

FIG. 4 shows a bottom plate 40 of, for example, BeO and a heat sink 41 of, for example, Copper on which a stack of subassemblies of the type shown in FIG. 3 are placed. Note that metalizations 44, 45, and 46 are properly positioned for bonding to the base plate (47) and for bonding to the next adjacent subassembly (48 and 49). Solder preforms (not shown) are positioned between the base plate 40 and the adjacent subassemblies as well as between each pair of subassemblies in the stack and between the subassemblies and the heat sink.

FIGS. 1–4 illustrate an arrangement employing both a "reverse" and a "forward" diode. Such an arrangement is described in U.S. Pat. No. 5,550,852, issued Aug. 27, 1996. That application is assigned to the assignee of the present application and is incorporated herein by reference. But the subassembly as described herein could be used with only a forward diode as should be apparant to one skilled in the art. Whether a reverse and a forward diode or only a forward diode is used, the front face of the diode is in a plane with face 17 to place the emitting facet of the diode in a proper position, and the rear face of the diode abutts the riser.

Also, either a single diode may be used with the subassembly of FIG. 3 or a diode bar may be used. The side view, in either case, appears as shown in FIG. 3.

Figure 5:
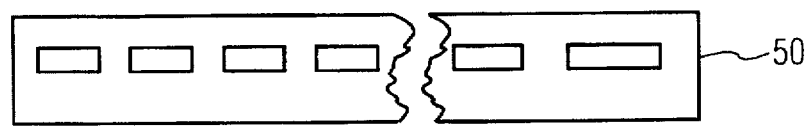
FIGS. 5 and 6 are schematic illustrations of a stack of laser bars at successive stages during assembly in a manner analogous to that of FIGS. 1–4.

FIG. 5 shows a schematic plan view of a laser bar 50 for use in the subassembly of FIG. 3. Two such bars may be used, one reverse and one forward as disclosed in copending application Ser. No. 08/591,983, filed Jan. 29, 1996 and assigned to the asignee of the present invention. This application also is specifically incorporated herein by reference. FIG. 5 shows a bar with only six emitting facets. It is to be understood that this number of facets is only illustrative.

Figure 6:
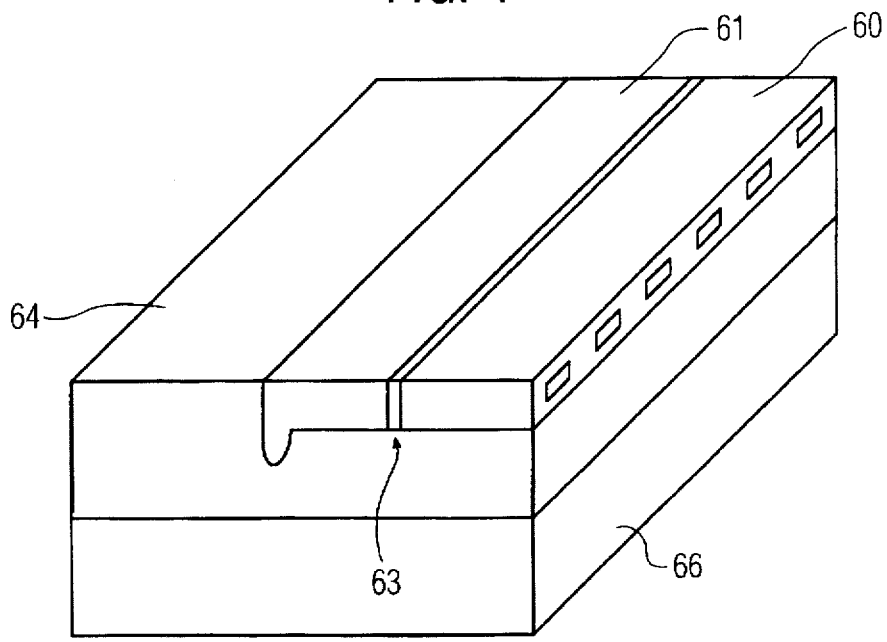

FIG. 6 shows laser diode bars 60 and 61 positioned on tread 63 of a submount 64. The submount has metallizations (not shown) as in FIG. 3 for stacking on a base plate 66 analogous to base plate 40 of FIG. 4 for coupling to a heat sink.

Figure 7:
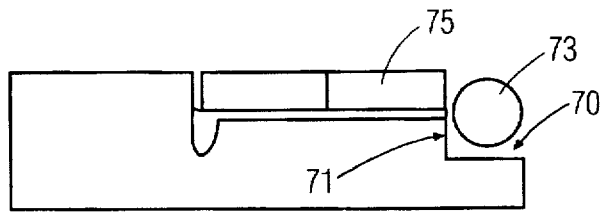
FIG. 7 shows a schematic side view of an arrangement of either FIGS. 3 or 6 including an additional tread 70 and riser 71.

FIG. 7 shows a schematic side view of an arrangement of either FIGS. 3 or 6 including an additional tread 70 and riser 71. The additional tread is for positioning a microlens 73 for collimating light from the emitting facets of the forward laser 75.

The stack of submounts of FIG. 6 provides a one-dimensional array of laser diodes. The stack of laser bars, as illustrated in FIG. 4, provides for a two-dimensional array of laser diodes. In either case, a reverse diode or a reverse diode bar may be used. But it is not necessary in accordance with the principles of this invention.

What is claimed is:

1. An electrically-insulating laser diode submount, said submount having first and second tread faces and a riser therebetween, said submount having front and back vertical faces parallel to said riser face and having a bottom face, said submount having first and second metallizations thereon electrically insulated from one another, said first metallization coating said back face and only a first portion of each of said second tread and said bottom surface, said second metallization coating only a second portion of said second tread, said riser, the entire first tread, said front face and only a second portion of said bottom surface.

2. A diode submount as in claim 1 also including a notch in said first tread at the base of said riser for defining a vertically oriented riser and for dividing the metallization coating said riser and said first tread into electrically isolated metallizations.

3. A subassembly including a diode submount as in claim 2 having a reverse diode abutting said riser and in electrical contact with the metallization coating said first tread, said submount also having a forward diode also in electrical contact with the metallization coating said first tread and having an emitting facet in registry with said front face.

4. A plurality of subassemblies as in claim 3 arranged in a stack wherein said second metallization on the second portion of each of said submounts is electrically connected to the reverse and forward diodes of the lower submount in said stack, said stack being mounted on an electrically-insulating bottom plate.

5. A plurality of subassemblies as in claim 4 also including a heat sink, each of said submounts being connected to said heat sink at said first metallization on said back face thereof.

6. A subassembly including a diode submount as in claim 2 having a reverse diode array abutting said riser and in electrical contact with the metallization coating said first tread, said submount also having a forward diode array also in electrical contact with the metallization coating said first tread and having a plurality of emitting facets in registry with said front face.

* * * * *